United States Patent
Ko et al.

[11] Patent Number: 5,817,579
[45] Date of Patent: Oct. 6, 1998

[54] TWO STEP PLASMA ETCH METHOD FOR FORMING SELF ALIGNED CONTACT

[75] Inventors: Jun-Cheng Ko, Taichung; Erik S. Jeng, Taipei, both of Taiwan

[73] Assignee: Vanguard International Semiconductor Corporation, Hsin-Chu, Taiwan

[21] Appl. No.: 835,577

[22] Filed: Apr. 9, 1997

[51] Int. Cl.[6] .................................................. H01L 21/302
[52] U.S. Cl. ...................... 438/740; 438/723; 438/724; 438/743; 438/744; 134/1.2
[58] Field of Search ................... 438/724, 723, 438/740, 743, 744; 134/1.2

[56] References Cited

U.S. PATENT DOCUMENTS

| | | | |
|---|---|---|---|
| 5,550,071 | 8/1996 | Ryou | 437/41 |
| 5,554,557 | 9/1996 | Koh | 437/52 |
| 5,595,627 | 1/1997 | Inazawa et al. | 156/643.1 |

FOREIGN PATENT DOCUMENTS 61-097824  5/1986  Japan.

OTHER PUBLICATIONS

"Dry Post–Etch Treatment Using $SF_6$ Chemistry for 0.2 mu m Contract Hole."; Japanese Journal of Applied Physics Part 1; (Regular Paper & Short Notes); vol. 34; No. 9A; pp. 5001–5005; Sep. 1995; Seung et. al.

"Influence of Gas Chemistry And Ion Energy On Contact Resistance"; Japanese Journal of Appl. Phys., Part 1 (1996); 35(4B); pp. 2494–2500; Hashimi et. al, Apr. 1996.

Egitto et al. "Plasma Etching Organic Materials. I Polymiden 02–CF4", J. Vac. Sci Technology B3(3) May/Jun. 1985 pp. 893–904.

*Primary Examiner*—R. Bruce Breneman
*Assistant Examiner*—George Goudreau
*Attorney, Agent, or Firm*—George O. Saile; Stephen B. Ackerman; Alek P. Szecsy

[57] ABSTRACT

A method for forming a via through a silicon oxide layer. There is first provided a substrate. There is then formed over the substrate a patterned silicon nitride layer which defines a contact beneath the patterned silicon nitride layer. There is then formed over the patterned silicon nitride layer a silicon oxide layer. There is then etched the silicon oxide layer through a first reactive ion etch (RIE) method employing a first etchant gas composition comprising a fluorocarbon etchant gas to form: (1) an etched silicon oxide layer which exposes the contact without substantially etching the patterned silicon nitride layer; and (2) a fluorocarbon polymer residue layer formed upon at least one of the etched silicon oxide layer and the patterned silicon nitride layer. Finally, there is stripped from the substrate the fluorocarbon polymer residue layer through a second reactive ion etch (RIE) method employing a second etchant gas composition comprising carbon tetrafluoride and oxygen. The method may also be employed in general for etching silicon oxide layers in the presence of silicon nitride layers. Similarly, the method may also in general be employed in removing fluorocarbon polymer residue layers from integrated circuit layers including but not limited to silicon oxide layers and silicon nitride layers.

19 Claims, 3 Drawing Sheets

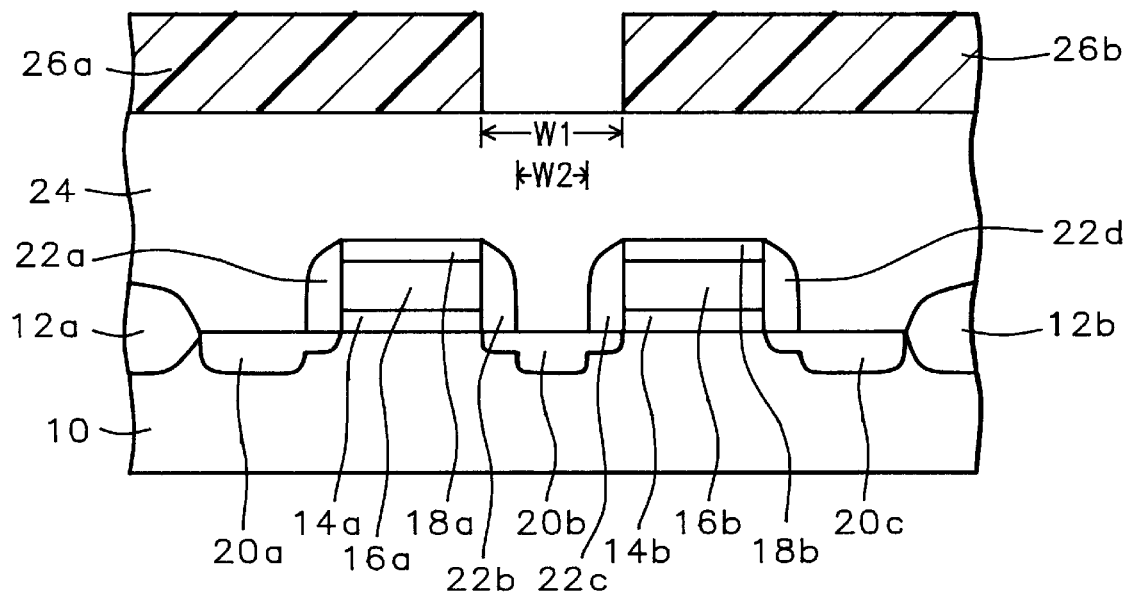
FIG. 1 – Prior Art
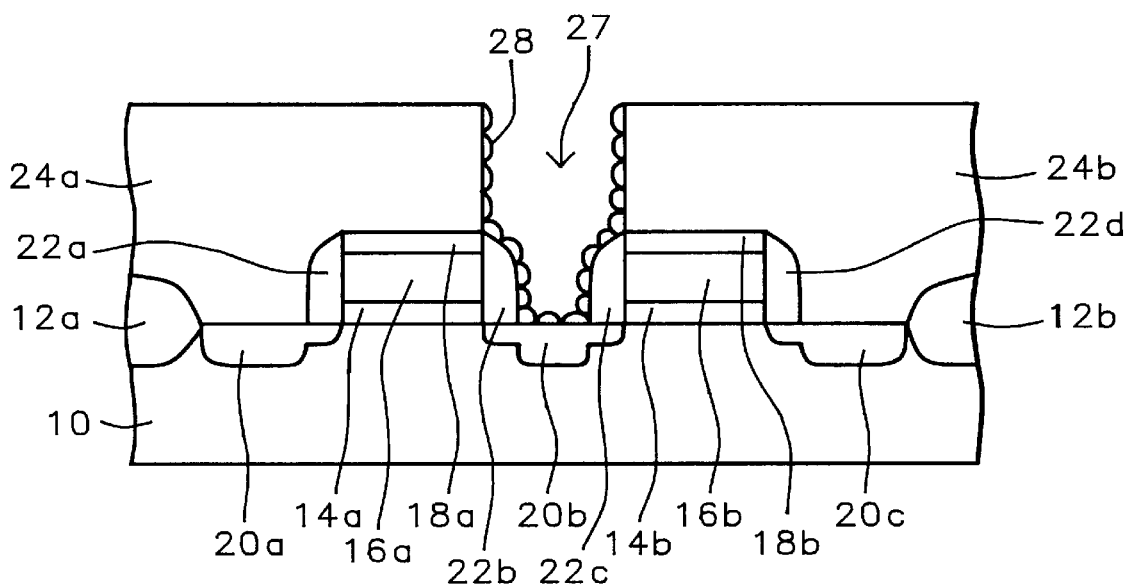
FIG. 2 – Prior Art

TWO STEP PLASMA ETCH METHOD FOR FORMING SELF ALIGNED CONTACT

BACKGROUND OF THE INVENTION

1. Field of the Invention

The present invention relates generally to methods for forming vias through dielectric layers within integrated circuits. More particularly, the present invention relates to methods for forming self aligned vias through dielectric layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device densities have increased and integrated circuit device dimensions have decreased, it has become increasingly important within advanced integrated circuits to form through dielectric layers within those advanced integrated circuits vias, such as but not limited to contact vias and interconnection vias, of similarly commensurately decreased cross-sectional dimensions such that the vias may be formed through the dielectric layers within the advanced integrated circuits without compromising the enhanced levels of integration desired within the advanced integrated circuits.

A representative but by no means limiting integrated circuit structure which illustrates one of several problems encountered when forming through a dielectric layer within an advanced integrated circuit a contact via within the advanced integrated circuit is illustrated by the schematic cross-sectional diagram of FIG. 1.

Shown in FIG. 1 is a semiconductor substrate 10 having formed therein an active region of the semiconductor substrate 10 defined by a pair of isolation regions 12a and 12b. Within and upon the active region of the semiconductor substrate 10 is formed an adjoining pair of field effect transistors (FETs) which share a source/drain region 20b formed within the active region of the semiconductor substrate 10. Employed in forming the adjoining pair of field effect transistors (FETs) is a pair of gate electrode stacks comprising: (1) a pair of gate dielectric layers 14a and 14b having formed and aligned thereupon; (2) a pair of gate electrode layers 16a and 16b which in turn have formed and aligned thereupon; (3) a pair of gate electrode dielectric cap layers 18a and 18b. In addition, there is formed within the semiconductor substrate 10 adjoining the pair of gate electrode stacks a series of source/drain regions 20a, 20b and 20c which are partially obscured by a series of dielectric spacer layers 22a, 22b, 22c and 22d formed adjoining the edges of the pair of gate electrode stacks. Finally, there is shown within FIG. 1 a blanket planarized pre-metal dielectric (PMD) layer 24 formed over the semiconductor substrate 10 including the adjoining pair of field effect transistors (FETs), where the blanket planarized pre-metal dielectric (PMD) layer 24 has formed thereupon a pair of patterned photoresist layers 26a and 26b.

As is understood by a person skilled in the art, when the gate electrode stacks within FIG. 1 are formed with a first separation width W1 upon the active region of the semiconductor substrate 10 and the first separation width W1 approximates a minimum resolvable separation width achievable with an advanced photoexposure apparatus, a second separation width W2 of the pair of dielectric spacer layers 22b and 22c which are typically formed adjoining the pair of gate electrode stacks through a self aligned reactive ion etch (RIE) anisotropic etching method will of necessity be less than the minimum resolvable separation width achievable with the advanced photoexposure apparatus. Similarly, presuming that the same photoexposure apparatus is employed in forming the patterned photoresist layers 26a and 26b as is employed in defining the separation width W1 of the gate electrode stacks, the patterned photoresist layers 26a and 26b will also have a minimum separation width W1 which approximates the minimum separation width achievable with the advanced photoexposure apparatus. The patterned photoresist layers 26a and 26b will also have a registration tolerance variation (not shown in FIG. 1) which typically displaces the patterned photoresist layers 26a and 26b with respect to the gate electrode stacks.

In order to avoid forming an oversized and misaligned contact via through the portion of the blanket planarized pre-metal dielectric (PMD) layer 24 between the dielectric spacer layers 22b and 22c when accessing the source/drain region 20b within the active region of the semiconductor substrate 10, it is known in the art to employ a selective reactive ion etch (RIE) method which forms, in part, the contact via through the blanket planarized pre-metal dielectric (PMD) layer 24 in a self aligned fashion. The results of forming the contact via through such a selective reactive ion etch (RIE) method are illustrated in FIG. 2.

Shown in FIG. 2 is a schematic cross-sectional diagram of an integrated circuit otherwise equivalent to the integrated circuit whose schematic cross-sectional diagram is illustrated in FIG. 1, but wherein the contact via 27 has been etched through the selective reactive ion etch (RIE) method to expose the portion of the source/drain region 20b not obscured by the dielectric spacer layers 22b and 22c. As illustrated within FIG. 2, the selective reactive ion etch (RIE) method etches the dielectric material from which is formed the blanket planarized pre-metal dielectric (PMD) layer 24 but does not appreciably etch the dielectric material from which is formed the dielectric spacer layers 22b and 22c. Within typical integrated circuit fabrications analogous or equivalent to the integrated circuit whose schematic cross-sectional diagram is illustrated in FIG. 1 and FIG. 2, it is common in the art of integrated circuit fabrication to employ pre-metal dielectric (PMD) layers, such as the blanket planarized pre-metal dielectric (PMD) layer 24, formed from a silicon oxide dielectric material, while simultaneously employing dielectric spacer layers, such as the dielectric spacer layers 22b and 22c formed from a silicon nitride dielectric material. When employing within an integrated circuit whose schematic cross-sectional diagram is analogous or equivalent to the integrated circuit whose schematic cross-sectional diagram is illustrated in FIG. 1 a pre-metal dielectric (PMD) layer formed of a silicon oxide dielectric material and a dielectric spacer layer formed of a silicon nitride material, it is possible to employ a selective reactive ion etch (RIE) method which typically employs a novel etchant gas composition comprising a fluorocarbon etchant gas to form with a substantial etch selectivity of the pre-metal dielectric (PMD) layer with respect to the dielectric spacer layer the integrated circuit whose schematic cross-sectional diagram is illustrated in FIG. 2.

While the use of a selective reactive ion etch (RIE) method employing a novel etchant gas composition comprising a perfluorocarbon etchant gas may readily provide from the integrated circuit whose schematic cross-sectional diagram is illustrated in FIG. 1 the integrated circuit whose schematic cross-sectional diagram is illustrated in FIG. 2 without compromising the width of the contact via 27 accessing the source/drain region 20b, under such circumstances the integrated circuit whose schematic cross-sectional diagram is illustrated in FIG. 2 is typically not formed without problems. In particular, there is typically formed, as illustrated in FIG. 2, a fluorocarbon polymer residue layer 28 within the contact via 27 upon at least either the pair of patterned planarized pre-metal dielectric (PMD) layers 24a and 24b or the pair of dielectric spacer layers 22b and 22c. As is similarly illustrated in FIG. 2, the fluorocarbon polymer residue layer 28 within the contact via 27 is difficult to remove and typically remains within the contact via 27 even when exposed to methods and materials employed in stripping the patterned photoresist layers 26a and 26b to yield the integrated circuit whose schematic cross-sectional diagram is illustrated in FIG. 2. Residue layers, such as the fluorocarbon polymer residue layer 28, formed within vias, such as the contact via 27 as illustrated in FIG. 2, are undesirable within advanced integrated circuit fabrication since those residue layers typically provide high contact resistances to conductor stud layers formed within the vias.

It is thus towards the goal of forming within integrated circuits vias, such as but not limited to contact vias and interconnection vias, through dielectric layers within those integrated circuits while avoiding fluorocarbon polymer residue layers formed within those vias that the present invention is generally directed.

Various disclosures may be found pertaining to integrated circuit etch methods, such as integrated circuit reactive ion etch (RIE) methods, for general etching of integrated circuit layers within integrated circuits, as well as for etching integrated circuit layers when forming integrated circuit structures within integrated circuits. For example, Egitto et al., in "Plasma Etching Organic Materials. I. Polyimide in O2-CF4," disclose several characteristics of binary mixtures of oxygen and carbon tetrafluoride employed as etchant gas compositions when etching through reactive ion etch (RIE) methods integrated circuit layers formed of polyimide materials. At carbon tetrafluoride concentrations of about 20 volume percent within a binary mixture with oxygen there is provided a reactive ion etch (RIE) etchant gas composition with optimally enhanced polyimide etch rate in comparison with a pure oxygen etchant gas composition within an otherwise equivalent reactive ion etch (RIE) plasma etch method.

In addition, Ryou, in U.S. Pat. No. 5,550,071 discloses an etching method for forming a conductor layer within a micro contact via accessing a semiconductor device electrode within an integrated circuit. The conductor layer and the micro contact via may be formed with a width narrower than an aperture within a patterned photoresist layer employed in defining the location and width of the conductor layer and micro contact via.

Finally, Koh et al., in U.S. Pat. No. 5,554,557 disclose an etching method for forming within an integrated circuit a fence shaped capacitor having formed therein a capacitor node self aligned upon an integrated circuit device electrode within the integrated circuit. The method employs two sets of sidewall spacers in forming the fence shaped capacitor.

Desirable in the art are additional methods through which vias, such as but not limited to contact vias and interconnection vias, may be formed within integrated circuits. Particularly desirable in the art are additional methods through which vias, such as but not limited to contact vias and interconnection vias, may be formed in a self aligned fashion within integrated circuits. Most particularly desirable in the art are additional methods through which vias, such as but not limited to contact vias and interconnection vias, may be formed in a self aligned fashion through silicon oxide dielectric layers within integrated circuits while: (1) employing reactive ion etch (RIE) methods which employ perfluorocarbon etchant gas compositions; and (2) avoiding fluorocarbon polymer residue layers formed within those vias. It is towards the foregoing goals that the present invention is more specifically directed.

SUMMARY OF THE INVENTION

A first object of the present invention is to provide a method for forming a via, such as but not limited to a contact via or an interconnection via, through a dielectric layer within an integrated circuit.

A second object of the present invention is to provide a method in accord with the first object of the present invention, where the via is formed through a self aligned method through the dielectric layer within the integrated circuit.

A third object of the present invention is to provide a method in accord with the first object of the present invention and the second object of the present invention, where there is avoided when forming the via through the dielectric layer within the integrated circuit through the self aligned method a fluorocarbon polymer residue layer formed within the via.

A fourth object of the present invention is to provide a method in accord with the first object of the present invention, the second object of the present invention or the third object of the present invention, which method is readily manufacturable.

In accord with the objects of the present invention, there is provided a method for forming a via through a dielectric layer within an integrated circuit. To practice the method of the present invention, there is first provided a substrate. There is then formed over the substrate a patterned silicon nitride layer which defines within the integrated circuit a contact beneath the patterned silicon nitride layer. There is then formed over the patterned silicon nitride layer a silicon oxide layer. The silicon oxide layer is then etched through a first reactive ion etch (RIE) method employing a first etchant gas composition comprising a fluorocarbon etchant gas to form: (1) a patterned silicon oxide layer having a via formed therethrough which exposes the contact without substantially etching the patterned silicon nitride layer; and (2) a fluorocarbon polymer residue layer formed upon at least one of the patterned silicon oxide layer and the patterned silicon nitride layer. Finally, there is stripped from the substrate the fluorocarbon polymer residue layer through a second reactive ion etch (RIE) method employing a second etchant gas composition comprising carbon tetrafluoride and oxygen.

The method of the present invention also contemplates that there may in general be formed through the method of the present invention etched silicon oxide layers in the presence of silicon nitride layers while avoiding fluorocarbon polymer residue layers formed upon those etched silicon oxide layers and/or silicon nitride layers.

Similarly, the method of the present invention also contemplates in general a method for stripping fluorocarbon polymer residue layers from integrated circuit layers including but not limited to silicon oxide layers and silicon nitride layers within integrated circuits.

Through the present invention there is provided a self aligned method for forming a via through a dielectric layer within an integrated circuit while avoiding a fluorocarbon polymer residue layer formed within the via through the dielectric layer. By: (1) employing within the method of the present invention a patterned silicon nitride layer which defines a contact formed beneath the patterned silicon nitride layer; and (2) forming through a first reactive ion etch (RIE) method through a silicon oxide layer formed upon the patterned silicon nitride layer a via accessing the contact while not substantially etching the patterned silicon nitride layer, there is formed through the present invention a via through a self aligned method through a dielectric layer within an integrated circuit. By employing within the method of the present invention a second reactive ion etch (RIE) method employing a second etchant gas composition comprising carbon tetrafluoride and oxygen to strip from the substrate the fluorocarbon polymer residue layer, there is removed, and therefore within the context of the present invention avoided, the fluorocarbon polymer residue layer when forming the via through the self aligned method through the dielectric layer. Within both the method of the present invention and the preferred embodiment of the method of the present invention removal of a fluorocarbon polymer residue layer is intended as synonymous with avoidance of a fluorocarbon polymer residue layer.

The method of the present invention is readily manufacturable. The method of the present invention provides that there is employed within the method of the present invention: (1) a substrate having formed thereover a patterned silicon nitride layer which defines a contact formed beneath the patterned silicon nitride layer; (2) a silicon oxide layer formed upon the patterned silicon nitride layer; (3) a first reactive ion etch (RIE) method employing a first etchant gas composition comprising a fluorocarbon etchant gas; and (4) a second reactive ion etch (RIE) method employing a second etchant gas composition comprising carbon tetrafluoride and oxygen. Methods and materials through which the foregoing layers and reactive ion etch (RIE) methods may be employed within integrated circuits are generally known within the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a series of schematic cross-sectional diagrams illustrating a fluorocarbon polymer residue layer formed within a via through a dielectric layer within an integrated circuit when the via is formed through the dielectric layer within the integrated circuit through a self aligned method conventional in the art of integrated circuit fabrication.

DESCRIPTION OF THE PREFERRED EMBODIMENT

The present invention provides a self aligned method for forming a via through a dielectric layer within an integrated circuit while avoiding a fluorocarbon polymer residue layer formed within the via through the dielectric layer. The method of the present invention achieves this goal by forming over a substrate within an integrated circuit a patterned silicon nitride layer which defines a contact formed beneath the patterned silicon nitride layer within the integrated circuit. The patterned silicon nitride layer then has formed thereupon a silicon oxide layer. There is then etched through a first reactive ion etch (RIE) method employing a first etchant gas composition comprising a fluorocarbon etchant gas the silicon oxide dielectric layer to form a via through the silicon oxide layer and expose the contact while not appreciably etching the patterned silicon nitride layer. Through the first reactive ion etch (RIE) method there is also simultaneously formed a fluorocarbon polymer residue layer within the via. There is then stripped through a second reactive ion etch (RIE) method employing a second etchant gas composition comprising carbon tetrafluoride and oxygen the fluorocarbon polymer residue layer from the semiconductor substrate.

As is understood by a person skilled in the art, in addition to forming vias through dielectric layers through the method of the present invention, the method of the present invention may also in general be employed when etching a silicon oxide layer in the presence of a silicon nitride layer within an integrated circuit in a fashion such that: (1) the silicon oxide layer is etched while not appreciably etching the silicon nitride layer; and (2) there is avoided when etching the silicon oxide layer in the presence of a silicon nitride layer a fluorocarbon polymer residue layer formed upon at least either the etched silicon oxide layer or the silicon nitride layer.

Similarly, as is also understood by a person skilled in the art, the second reactive ion etch (RIE) method within the method of the present invention may be employed in removing from various integrated circuit layers, such as but not limited to silicon oxide layers and silicon nitride layers within integrated circuits fluorocarbon polymer residue layers. The various integrated circuit layers from which may be removed the fluorocarbon polymer residue layers include but are not limited to conductor layers, semiconductor layers and dielectric layers.

Figure 3:
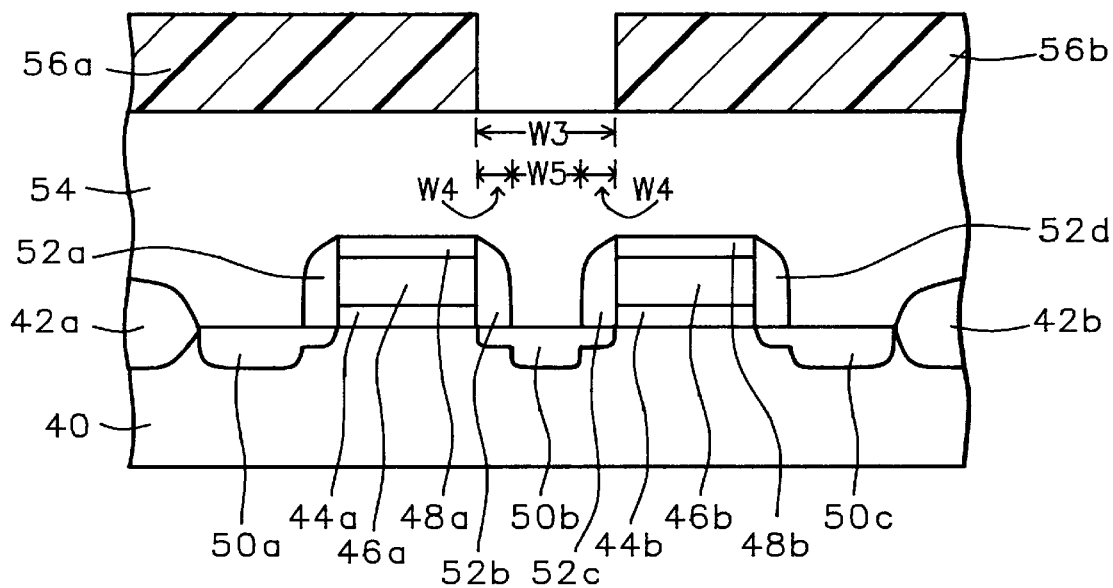
FIG. 3 to FIG. 6 show a series of schematic cross-sectional diagrams illustrating the results of forming through a self aligned method in accord with the preferred embodiment of the method of the present invention a via through a dielectric layer within an integrated circuit while avoiding a fluorocarbon polymer residue layer formed within the via through the dielectric layer within the integrated circuit.

Referring now to FIG. 3 to FIG. 6, there is shown a series of schematic cross-sectional diagrams illustrating the results of progressive stages in forming through a silicon oxide dielectric layer within an integrated circuit a contact via accessing a contact defined by a patterned silicon nitride layer formed beneath the silicon oxide layer in accord with a preferred embodiment of the method of the present invention. Shown in FIG. 3 is a schematic cross-sectional diagram of the integrated circuit at an early stage in practice of the preferred embodiment of the method of the present invention.

Shown in FIG. 3 is a semiconductor substrate 40 having formed therein an active region of the semiconductor substrate 40 defined by the isolation regions 42a and 42b. Although it is known in the art of integrated circuit fabrication that semiconductor substrates are available with either dopant polarity, various dopant concentrations and several crystallographic orientations, for the preferred embodiment of the method of the present invention the semiconductor substrate 40 is preferably a (100) silicon semiconductor substrate having an N– or P– doping. Similarly, although it is also known in the art of integrated circuit fabrication that isolation regions may be formed within and/or upon semiconductor substrates through several methods, including but not limited to isolation region thermal growth methods and isolation region deposition/ patterning methods, for the preferred embodiment of the method of the present invention the isolation regions 42a and 42b are preferably formed within and upon the semiconductor substrate 40 through an isolation region thermal growth method to form isolation regions 42a and 42b of silicon oxide within and upon the semiconductor substrate 40.

There is also shown in FIG. 3 formed within and upon the active region of the semiconductor substrate 40 an adjoining pair of field effect transistors (FETs) which share a source/ drain region 50b. As is illustrated in FIG. 3, the adjoining pair of field effect transistors (PETs) includes a pair of gate electrode stacks comprised of: (1) a pair of gate dielectric layers 44a and 44b having formed and aligned thereupon; (2) a pair of gate electrodes 46a and 46b in turn having formed and aligned thereupon; (3) a pair of silicon nitride gate electrode dielectric cap layers 48a and 48b. The adjoining pair of field effect transistors (FETs) also includes: (1) a series of source/drain regions 50a, 50b and 50c formed within the active region of the semiconductor substrate 40 at areas not occupied by the pair of gate electrode stacks; and (2) a series of silicon nitride dielectric spacer layers 52a, 52b, 52c and 52d formed adjoining the pair of gate electrode stacks. Each of the foregoing layers and regions may be formed through methods and materials as are conventional in the art of forming such layers and regions within field effect transistors (FETs) within integrated circuits.

Typically and preferably, each gate dielectric layer 44a or 44b within the pair of gate dielectric layers 44a and 44b is formed upon the active region of the semiconductor substrate 40 from a silicon oxide dielectric material formed to a thickness of from about 50 to about 100 angstroms. Typically and preferably, each gate electrode layer 46a or 46b within the pair of gate electrode layers 46a and 46b is formed of a doped polysilicon or polycide material formed and aligned upon the corresponding gate dielectric layer 44a or 44b to a thickness of from about 1000 to about 2000 angstroms. Typically and preferably, each silicon nitride gate electrode dielectric cap layer 48a or 48b within the pair of silicon nitride gate electrode dielectric cap layers 48a and 48b is formed and aligned upon the corresponding gate electrode layer 46a or 46b to a thickness of from about 1000 to about 3000 angstroms. Similarly, typically and preferably each source/drain region 50a, 50b or 50c within the series of source/drain regions 50a, 50b and 50c is formed through a two step ion implantation method employing: (1) a low dose ion implant at an ion implantation dose of from about 1E12 to about 1E13 ions per square centimeter and an ion implantation energy of from about 10 to about 30 keV prior to forming the series of silicon nitride dielectric spacer layers 52a, 52b, 52c and 52d adjoining the gate electrode stacks, followed by; (2) a high dose ion implant at an ion implantation dose of from about 1E14 to about 1E15 ions per square centimeter and an ion implantation energy of from about 5 to about 30 keV after forming the series of silicon nitride dielectric spacer layers 52a, 52b, 52c and 52d adjoining the pair of gate electrode stacks. Finally, the series of silicon nitride dielectric spacer layers 52a, 52b, 52c and 52d is typically and preferably formed through an anisotropic etching method employing a blanket silicon nitride dielectric layer, as is common in the art of integrated circuit fabrication.

Within FIG. 3, the gate electrode stacks are typically and preferably separated by a width W3 of from about 0.3 to about 0.5 microns upon the active region of the semiconductor substrate 40, while the silicon nitride dielectric spacer layers 52b and 52c are each typically and preferably formed with a width W4 of from about 0.08 to about 0.10 microns upon the source/drain region 50b within the active region of the semiconductor substrate 40 microns, thus leaving exposed a source/drain region 50b contact defined by the silicon nitride spacer layers 52a and 52b of a width W5 of about 0.14 to about 0.30 microns, where W3, W4 and W5 are as illustrated in FIG. 3.

Finally, there is shown in FIG. 3 formed over the semiconductor substrate 40 including the adjoining pair of field effect transistors (FETs) a blanket planarized pre-metal dielectric (PMD) layer 54 having formed thereupon a pair of patterned photoresist layers 56a and 56b. Similarly with the layers and regions which comprise the pair of field effect transistors (FETs) formed within and upon the semiconductor substrate 40 beneath the blanket planarized pre-metal dielectric (PMD) layer 54 and the patterned photoresist layers 56a and 56b, the blanket planarized pre-metal dielectric (PMD) layer 54 and the patterned photoresist layers 56a and 56b may with certain limitations also be formed through methods and materials as are conventional in the art of integrated circuit fabrication.

With respect to the blanket planarized pre-metal dielectric (PMD) layer 54, the blanket planarized pre-metal dielectric (PMD) layer 54 is preferably formed of a silicon oxide dielectric material exhibiting optimal etch selectivity of the silicon oxide dielectric material with respect to the silicon nitride material from which is formed the silicon nitride dielectric spacer layers 52a, 52b, 52c and 52d. Preferably the etch selectivity of the silicon oxide dielectric material with respect to the silicon nitride dielectric material is at least about 10:1. Preferably such a silicon oxide dielectric material is formed through a chemical vapor deposition (CVD) method or a plasma enhanced chemical vapor deposition (PECVD) method, although other deposition methods, such as but not limited to physical vapor deposition (PVD) sputtering methods, may also be employed in forming the blanket planarized pre-metal dielectric (PMD) layer 54. As is understood by a person skilled in the art, the blanket planarized pre-metal dielectric (PMD) layer 54 is typically and preferably formed from a corresponding blanket conformal pre-metal dielectric (PMD) layer which is subsequently planarized through a planning method as is conventional in the art, such as but not limited to a reactive ion etch (RIE) etchback planarizing method or a chemical mechanical polish (CMP) planarizing method. Preferably, the blanket planarized pre-metal dielectric (PMD) layer 54 is formed to a thickness of from about 1000 to about 4000 angstroms.

With respect to the patterned photoresist layers 56a and 56b, the patterned photoresist layers 56a and 56b are typically and preferably formed of a positive novolak photoresist material or a polymethylmethacrylate (PMMA) photoresist material through which patterned photoresist layers are typically formed with minimal linewidth/aperture width within advanced integrated circuits and with optimal stability within advanced integrated circuits, although other photoresist materials, including but not limited to other positive photoresist materials and other negative photoresist materials, may also be employed in forming the patterned photoresist layers 56a and 56b. Preferably, the patterned photoresist layers 56a and 56b are formed to a thickness of from about 7000 to about 12000 angstroms.

Figure 4:
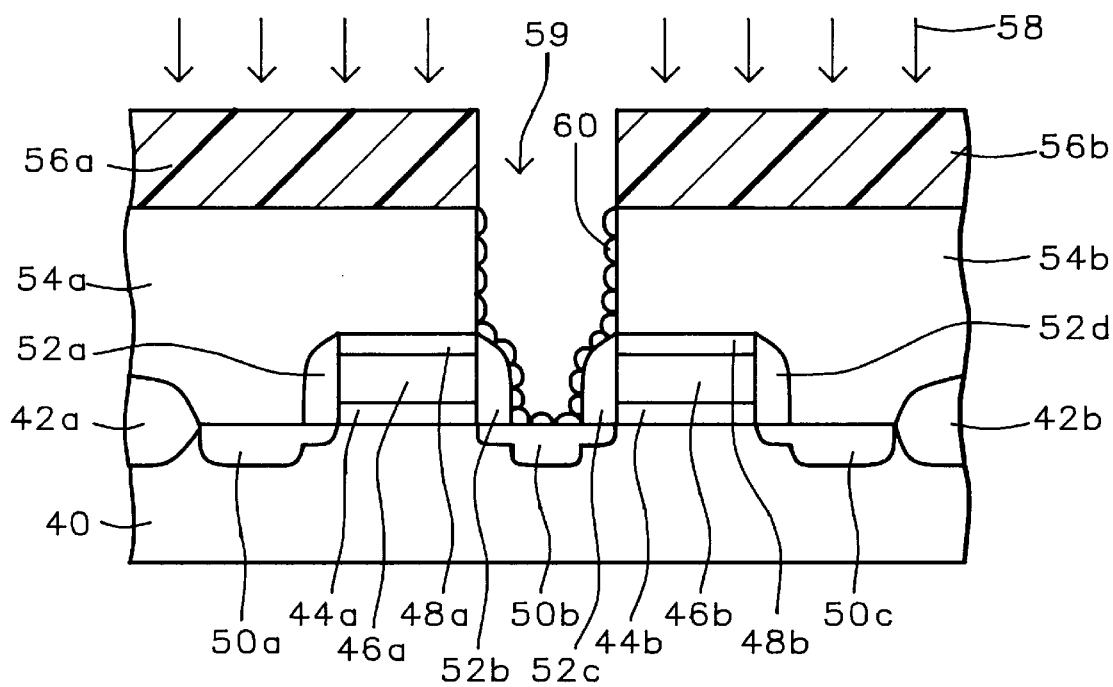

Referring now to FIG. 4, there is shown a schematic cross-sectional diagram illustrating the results of further processing of the integrated circuit whose schematic cross-sectional diagram is illustrated in FIG. 3.

Shown in FIG. 4 is the results of etching through a first reactive ion etch (RIE) method employing a first plasma 58 a contact via 59 through the blanket planarized pre-metal dielectric (PMD) layer 54 while not substantially etching the silicon nitride dielectric spacer layers 52b and 52c to access the source/drain region 50b contact defined by the silicon nitride dielectric spacer layers 52b and 52c, thus simultaneously forming the patterned planarized pre-metal dielectric layers 54a and 54b. When forming the contact via 59 through the blanket planarized pre-metal dielectric (PMD) layer 54 to access the source/drain region 50b contact defined by the silicon nitride dielectric spacer layers 52b and 52c without substantially etching the silicon nitride dielectric spacer layers 52b and 52c through the preferred embodiment of the present invention there is simultaneously formed the fluorocarbon polymer residue layer 60 upon at least either the patterned planarized pre-metal dielectric (PMD) layers 54a and 54b or the silicon nitride dielectric spacer layers 52b and 52c within the contact via 59. Within the context of the preferred embodiment of the method of the present invention, the fluorocarbon polymer residue layer 60 is typically formed as a result of employing within the first reactive ion etch (RIE) method employed within the preferred embodiment of the method of the present invention the first plasma 58 which etches the blanket planarized pre-metal dielectric (PMD) layer 54 while not substantially etching the silicon nitride dielectric spacer layers 52b and 52c.

For the preferred embodiment of the method of the present invention, it has been found experimentally that a first etchant gas composition employed within the first plasma 58 such that the contact via 59 is formed through the blanket planarized pre-metal dielectric (PMD) layer 54 while not substantially etching the silicon nitride dielectric spacer layers 52a and 52b preferably comprises octafluorocyclobutane (ie: C4F8), carbon monoxide (ie: CO) and argon (ie: Ar). More preferably, the first etchant gas composition preferably consists essentially of octafluorocyclobutane, carbon monoxide and argon. Preferably, the first reactive ion etch (RIE) method also employs: (1) a reactor chamber pressure of from about 25 to about 45 mtorr; (2) a radio frequency power of from about 1300 to about 1700 watts at a radio frequency of 13.56 MHZ; (3) a semiconductor substrate 40 temperature of from about 20 to about 60 degrees centigrade; (4) an octafluorocyclobutane flow rate of from about 12 to about 24 standard cubic centimeters per minute (sccm); (5) a carbon monoxide flow rate of from about 150 to about 350 standard cubic centimeters per minute (sccm); and (6) an argon flow rate of from about 250 to about 500 standard cubic centimeters per minute (sccm), for a time period sufficient to completely etch the contact via 59 through the blanket planarized pre-metal dielectric (PMD) layer 54 and expose the contact within the source/drain region 50b defined by the silicon nitride dielectric spacer layers 52b and 52c.

Within the context of the foregoing parameters and limits, the first plasma 58 employed within the preferred embodiment of the method of the present invention typically exhibits an etch selectivity of the blanket planarized pre-metal dielectric (PMD) layer 54 with respect to the silicon nitride dielectric spacer layers 52b and 52c of at least about 10:1. Similarly, within the preferred embodiment of the method of the present invention the fluorocarbon polymer residue layer 60 is typically formed to a thickness of from about 100 to about 1000 angstroms within the contact via 59.

Figure 5:
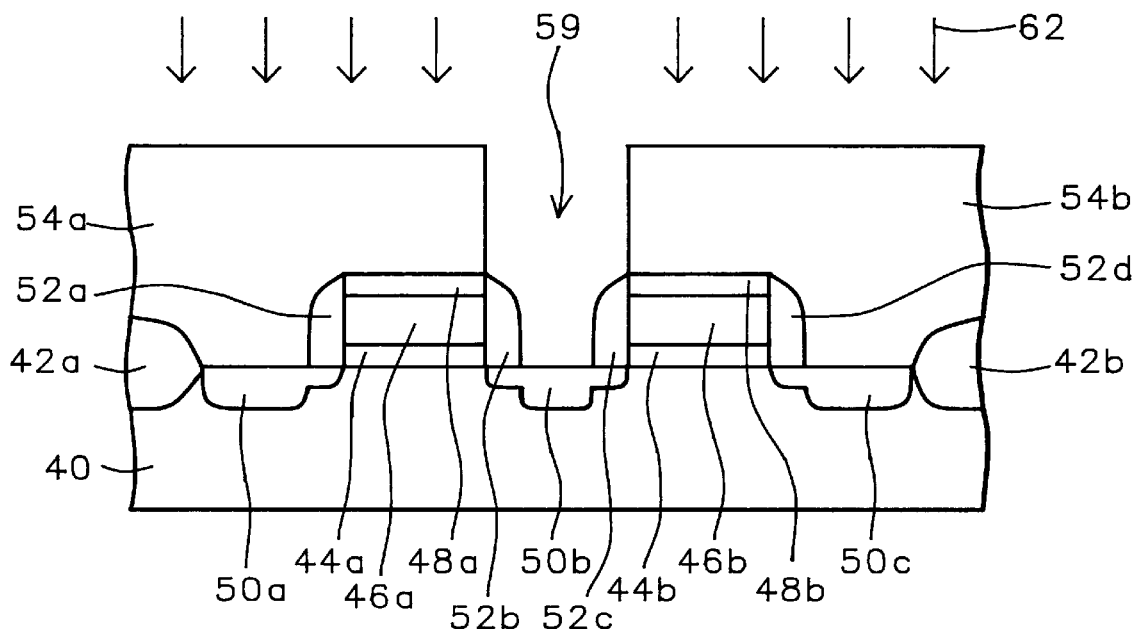

Referring now to FIG. 5, there is shown a schematic cross-sectional diagram illustrating the results of further processing of the integrated circuit whose schematic cross-sectional diagram is illustrated in FIG. 4.

Shown in FIG. 5 is a schematic cross-sectional diagram of an integrated circuit otherwise equivalent to the integrated circuit whose schematic cross-sectional diagram is illustrated in FIG. 4, but from whose surface has been stripped: (1) the patterned photoresist layers 56a and 56b; and (2) the fluorocarbon polymer residue layer 60. The patterned photoresist layers 56a and 56b, and the fluorocarbon polymer residue layer 60, are preferably stripped from the surface of the integrated circuit whose schematic cross-sectional diagram is illustrated in FIG. 4 to yield the integrated circuit whose schematic cross-sectional diagram is illustrated in FIG. 5 through a second reactive ion etch (RIE) method employing a second plasma 62. Within the preferred embodiment of the method of the present invention, the second plasma 62 exhibits a selectivity for the fluorocarbon polymer residue layer 60 with respect to either the patterned planarized pre-metal dielectric (PMD) layers 54a and 54b, the silicon nitride dielectric spacer layers 52b and 52c or the semiconductor substrate 40. Preferably, within the preferred embodiment of the method of the present invention the second plasma 62 exhibits an etch selectivity ratio of the fluorocarbon polymer residue layer 60 with respect to either the patterned planarized pre-metal dielectric (PMD) layers 54a and 54b, the silicon nitride dielectric spacer layers 52b and 52c or the semiconductor substrate 40 of at least about 20:1.

It has been found experimentally within the preferred embodiment of the method of the present invention that the second plasma 62 which effectively strips the patterned photoresist layers 56a and 56b, and more particularly the fluorocarbon polymer residue layer 60 from the integrated circuit whose schematic cross-sectional diagram is illustrated in FIG. 5 while not substantially etching the patterned planarized pre-metal dielectric (PMD) layers 54a and 54b, the silicon nitride dielectric spacer layers 52b and 52c or the semiconductor substrate 40 preferably employs a second etchant gas composition comprising carbon tetrafluoride (ie: CF4) and oxygen (ie: O2), more preferably with a carbon tetrafluoride:oxygen volume ratio of from about 1:5 to about 1:20. Yet more preferably, the second plasma 62 employs a second etchant gas composition consisting essentially of carbon tetrafluoride and oxygen, still yet more preferably with a carbon tetrafluoride:oxygen volume ratio of from about 1:5 to about 1:20. Preferably, the second reactive ion etch (RIE) method also employs: (1) a reactor chamber pressure of from about 800 to about 1200 mtorr; (2) a radio frequency power of from about 500 to about 1000 watts at a radio frequency of 13.56 MHZ; (3) a semiconductor substrate 40 temperature of from about 20 to about 60 degrees centigrade; (4) a carbon tetrafluoride flow rate of from about 100 to about 400 standard cubic centimeters per minute (sccm); (5) an oxygen flow rate of from about 1000 to about 3000 standard cubic centimeters per minute (sccm); and (6) an exposure time of from about 30 to about 120 seconds.

As is understood by a person skilled in the art, it is also feasible within the method of the present invention that there may be sequentially stripped from the integrated circuit whose schematic cross-sectional diagram is illustrated in FIG. 4: (1) the patterned photoresist layers 56a and 56b through an oxygen plasma stripping method as is conventional in the art; prior to (2) the fluorocarbon polymer residue layer 60 through the second plasma 62. Thus use of such an intermediate oxygen plasma stripping method is typically neither required nor desired within the method of the present invention since the second plasma 62 employed within method of the present invention and the preferred embodiment of the method of the present invention simultaneously efficiently strips both: (1) the patterned photoresist layers 56a and 56b; and (2) the fluorocarbon polymer residue layer 60 from the integrated circuit whose schematic cross-sectional diagram is illustrated by FIG. 4 to provide the integrated circuit whose schematic cross-sectional diagram is illustrated in FIG. 5.

Figure 6:
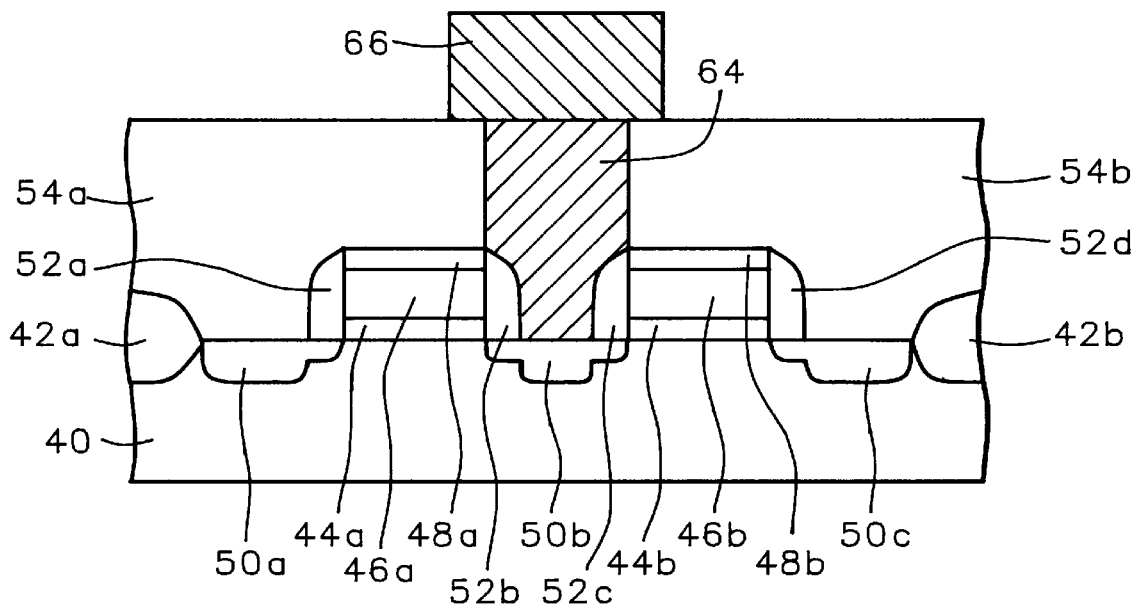

Referring now to FIG. 6, there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit otherwise equivalent to the integrated circuit whose schematic cross-sectional diagram is illustrated in FIG. 5, but wherein within the contact via 59 there is formed a conductive contact stud 64 and wherein upon the conductive contact stud 64 there is formed a patterned first conductor layer 66. Both the conductive contact stud 64 and the patterned first conductor layer 66 may be formed through methods and materials as are conventional in the art of integrated circuit fabrication, including but not limited to thermally assisted evaporation methods, electron beam assisted evaporation methods, chemical vapor deposition (CVD) methods and physical vapor deposition (PVD) sputtering methods through which may be formed conductive contact studs and patterned conductor layers of conductor materials including but not limited to metals, metal alloys, doped polysilicon and polycides. For the preferred embodiment of the method of the present invention, the conductive contact stud 64 is preferably formed at least in part of tungsten metal, as is common in the art of integrated circuit fabrication, while the patterned first conductor layer 66 is preferably formed at least in part of an aluminum containing conductor alloy, as is also common in the art of integrated circuit fabrication. Preferably, the conductive contact stud 64 is formed to a thickness sufficient to reach the upper surfaces of the patterned planarized pre-metal dielectric (PMD) layers 54a and 54b. Preferably, the patterned first conductor layer 66 is formed to a thickness of from about 1500 to about 3500 angstroms.

Upon forming the conductive contact stud 64 within the contact via 59 within the integrated circuit whose schematic cross-sectional diagram is illustrated in FIG. 6, there is formed through the preferred embodiment of the method of the present invention an integrated circuit having formed therein through a self aligned method a contact via through a dielectric layer, where the contact via subsequently has formed therein a conductive contact stud which exhibits low contact resistance. The method of the present invention achieves this goal by employing: (1) a first reactive ion etch (RIE) method which in part provides a self aligned contact via through the dielectric layer; and (2) a second reactive ion etch (RIE) method which strips from within the contact via a fluorocarbon polymer residue layer which would otherwise provide a high contact resistance to the conductive contact stud formed within the contact via.

As is understood by a person skilled in the art, although the preferred embodiment of the method of the present invention illustrates the method of the present invention employed in removing a fluorocarbon polymer residue layer from a contact via formed through a self aligned method through a dielectric layer within an integrated circuit, the method of the present invention may also be employed in removing fluorocarbon polymer residue layers from within vias other than contact vias through dielectric layers within integrated circuits. Such other vias include, but are not limited to, interconnection vias within integrated circuits.

EXAMPLES

Upon each of four semiconductor substrates was formed 60 multi-via test structures designed to test the integrity of 96 conductive studs formed within vias formed through a silicon oxide dielectric layer. The design of the via test structures provided for shunting the bottoms and tops of a series of 96 conductive studs formed through the silicon oxide dielectric layer to form a series connection of the 96 conductive studs. The silicon oxide dielectric layers through which the vias were formed were formed to a thickness of about 3000 angstroms through a low pressure chemical vapor deposition (PECVD) method employing tetra-ethyl-ortho-silicate (TEOS) as a silicon source material. To pattern the vias through the silicon oxide dielectric layers there was employed a positive novolak photoresist material available from Sumitomo Chemical Company as JCR-38 photoresist material. The photoresist material was coated and photoexposed upon the silicon oxide dielectric layers to provide patterned photoresist layers of thickness about 7000 angstroms defining circular apertures of diameter about 0.35 microns exposing portions of the silicon oxide dielectric layers through which subsequently were etched the series of vias.

The portions of the silicon oxide dielectric layers exposed through the patterned photoresist layers upon each of the four semiconductor substrates were then etched employing a first reactive ion etch (RIE) method in turn employing a first plasma in accord with the preferred embodiment of the method of the present invention. The first plasma comprised octafluorocyclobutane, carbon monoxide and argon. The first reactive ion etch (RIE) method also employed: (1) a reactor chamber pressure of about 40 mtorr; (2) a radio frequency power of about 1500 watts at a radio frequency of 13.56 MHZ; (3) a semiconductor substrate temperature of about 20 degrees centigrade; (4) an octafluorocyclobutane flow rate of about 24 standard cubic centimeters per minute (sccm); (5) a carbon monoxide flow rate of about 300 standard cubic centimeters per minute (sccm); and (6) a argon flow rate of about 400 standard cubic centimeters per minute (sccm), for a time period of about 120 seconds. Upon forming the vias through the silicon oxide dielectric layers there was observed fluorocarbon polymer residue layers formed within the vias.

There was then stripped: (1) the patterned photoresist layers from the silicon oxide dielectric layers; and (2) the fluorocarbon polymer residue layers from within the vias within the silicon oxide dielectric layers.

For the series of test structures upon one of the four semiconductor substrates, the patterned photoresist layers and the fluorocarbon polymer residue layers were stripped through an oxygen plasma stripping method as is conventional in the art of integrated circuit fabrication. The oxygen plasma stripping method employed: (1) a reactor chamber pressure of about 1000 mtorr; (2) a radio frequency power of about 700 watts at a radio frequency of 13.56 MHZ; (3) a semiconductor substrate temperature of about 20 degrees centigrade; (4) an oxygen flow rate of about 2000 standard cubic centimeters per minute (sccm); and (5) an etch time of about 1 minute.

For the series of test structures upon the three remaining semiconductor substrates, the patterned photoresist layers and the fluorocarbon polymer residue layers were stripped through a second reactive ion etch (RIE) method employing a second plasma in accord with the preferred embodiment of the method of the present invention, where the second plasma employed an etchant gas composition of carbon tetrafluoride and oxygen at a carbon tetrafluoride:oxygen volume ratio of about 1:10. The second reactive ion etch (RIE) method also employed: (1) a reactor chamber pressure of about 1000 mtorr; (2) a radio frequency power of about 700 watts at a radio frequency of 13.56 MHZ; (3) a semiconductor substrate temperature of about 20 degrees centigrade; (4) a carbon tetrafluoride flow rate of about 200 standard cubic centimeters per minute (sccm); (5) an oxygen flow rate of about 2000 standard cubic centimeters per minute (sccm); and (6) an etch time of about 1 minute.

The via test structures upon the four semiconductor substrates where then fabricated to completion and resistances of serial via chains formed within the via test structures were then measured through methods as are conventional in the art. The percentage of test structures whose serial via chains were within an arbitrary resistance specification limit (ie: less than 10 Kohms) are reported in Table I as a function of the semiconductor substrate upon which was formed the via test structure.

TABLE I

| Example | P/R and F/C Residue Stripping RIE | Spec. Conform % |
|---------|-----------------------------------|-----------------|
| 1 | oxygen only | 53 |
| 2 | 10% CF4 in oxygen | 82 |
| 3 | 10% CF4 in oxygen | 72 |
| 4 | 10% CF4 in oxygen | 88 |

As is seen from review of the data presented within Table I, a patterned photoresist layer and fluorocarbon polymer residue layer reactive ion etch (RIE) stripping method employing an etchant gas composition comprising carbon tetrafluoride and oxygen provides vias within a patterned silicon oxide dielectric layer into which may be formed conductor studs, such as but not limited to conductor contact studs, with lower levels of resistance.

As is understood by a person skilled in the art, the preferred embodiment and examples of the present invention are illustrative of the present invention rather than limiting of the present invention. Revisions and modifications may be made to materials structures and dimensions through which is provided the preferred embodiment and examples of the present invention while still providing embodiments and examples which are within the spirit and scope of the present invention, as defined by the accompanying claims.

What is claimed is:

1. A method for removing a fluorocarbon polymer residue layer from a substrate layer within an integrated circuit comprising:

providing a substrate layer;

forming over the substrate layer a photoresist layer;

forming upon the substrate layer a fluorocarbon polymer residue layer; and stripping simultaneously from the substrate layer the photoresist layer and the fluorocarbon polymer residue layer through a first reactive ion etch (RIE) method employing a first etchant gas composition comprising carbon tetrafluoride and oxygen.

2. The method of claim 1 wherein the substrate layer is selected from the group of substrate layers consisting of conductor substrate layers, semiconductor substrate layers and dielectric substrate layers.

3. The method of claim 1 wherein the fluorocarbon polymer residue layer is formed through selectively etching a silicon oxide layer in the presence of a silicon nitride layer formed upon the substrate layer through a second reactive ion etch (RIE) method employing a second etchant gas composition comprising octafluorocyclobutane, carbon monoxide and argon.

4. The method of claim 3 wherein:

octafluorocyclobutane is employed at a flow rate of from 12 to 24 standard cubic centimeters per minute (sccm);

carbon monoxide is employed at a flow rate of from 150 to 350 standard cubic centimeters per minute (sccm); and argon is employed at a flow rate of from 250 to 500 standard cubic centimeters per minute (sccm).

5. The method of claim 1 wherein the first reactive ion etch (RIE) method employs a carbon tetrafluoride:oxygen volume ratio of from 1:5 to 1:20.

6. A method for etching a silicon oxide layer comprising:

providing a substrate;

forming over the substrate a silicon oxide layer;

forming over the substrate a photoresist layer;

etching the silicon oxide layer through a first reactive ion etch (RIE) method employing a first etchant gas composition comprising a fluorocarbon etchant gas to form an etched silicon oxide layer and a fluorocarbon polymer residue layer thereupon; and stripping simultaneously from the substrate the photoresist layer and the fluorocarbon polymer residue layer through a second reactive ion etch (RIE) method employing a second etchant gas composition comprising carbon tetrafluoride and oxygen.

7. The method of claim 6 wherein the first etchant gas composition comprises octafluorocyclobutane, carbon monoxide and argon.

8. The method of claim 7 wherein:

octafluorocyclobutane is employed at a flow rate of from 12 to 24 standard cubic centimeters per minute (sccm);

carbon monoxide is employed at a flow rate of from 150 to 350 standard cubic centimeters per minute (sccm); and argon is employed at a flow rate of from 250 to 500 standard cubic centimeters per minute (sccm).

9. The method of claim 6 wherein the second reactive ion etch (RIE) method employs a carbon tetrafluoride:oxygen volume ratio of from 1:5 to 1:20.

10. A method for selectively etching a silicon oxide layer in the presence of a silicon nitride layer comprising:

providing a substrate;

forming over the substrate a silicon oxide layer in contact with a silicon nitride layer;

forming over the substrate a photoresist layer;

etching the silicon oxide layer through a first reactive ion etch (RIE) method employing a first etchant gas composition comprising a fluorocarbon etchant gas to form an etched silicon oxide layer without etching the silicon nitride layer and a fluorocarbon polymer residue layer formed upon at least one of the etched silicon oxide layer and the silicon nitride layer; and stripping simultaneously from the substrate the photoresist layer and the fluorocarbon polymer residue layer through a second reactive ion etch (RIE) method employing a second etchant gas composition comprising carbon tetrafluoride and oxygen.

11. The method of claim 10 wherein the first etchant gas composition comprises octafluorocyclobutane, carbon monoxide and argon.

12. The method of claim 11 wherein:

octafluorocyclobutane is employed at a flow rate of from 12 to 24 standard cubic centimeters per minute (sccm);

carbon monoxide is employed at a flow rate of from 150 to 350 standard cubic centimeters per minute (sccm); and argon is employed at a flow rate of from 250 to 500 standard cubic centimeters per minute (sccm).

13. The method of claim 10 wherein the second reactive ion etch (RIE) method employs a carbon tetrafluoride:oxygen ratio of from 1:5 to 1:20.

14. A method for forming a via through a silicon oxide layer comprising:

providing a substrate;

forming over the substrate a patterned silicon nitride layer which defines a contact beneath the patterned silicon nitride layer;

forming over the patterned silicon nitride layer a silicon oxide layer;

forming over the silicon oxide layer a patterned photoresist layer:

etching while employing the patterned photoresist layer as an etch mask layer the silicon oxide layer through a first reactive ion etch (RIE) method employing a first etchant gas composition comprising a fluorocarbon etchant gas to form an etched silicon oxide layer which exposes the contact without etching the patterned silicon nitride layer and a fluorocarbon polymer residue layer formed upon at least one of the etched silicon oxide layer and the patterned silicon nitride layer; and stripping simultaneously from the substrate the patterned photoresist layer and the fluorocarbon polymer residue layer through a second reactive ion etch (RIE) method employing a second etchant gas composition comprising carbon tetrafluoride and oxygen.

15. The method of claim 14 wherein:

the substrate is a semiconductor substrate; and the semiconductor substrate has integrated circuit devices formed therein and thereupon.

16. The method of claim 14 wherein the via is selected from the group of vias consisting of contact vias and interconnection vias.

17. The method of claim 14 wherein the first etchant gas composition comprises octafluorocyclobutane, carbon monoxide and argon.

18. The method of claim 17 wherein:

octafluorocyclobutane is employed at a flow rate of from 12 to 24 standard cubic centimeters per minute (sccm);

carbon monoxide is employed at a flow rate of from 150 to 350 standard cubic centimeters per minute (sccm); and argon is employed at a flow rate of from 250 to 500 standard cubic centimeters per minute (sccm).

19. The method of claim 14 wherein the second reactive ion etch (RIE) method employs a carbon tetrafluoride:oxygen ratio of from 1:5 to 1:20.

* * * * *